United States Patent [19]

Filler

[11] Patent Number: 4,918,372
[45] Date of Patent: Apr. 17, 1990

[54] METHOD OF MEASURING THE THERMAL HYSTERESIS OF QUARTZ CRYSTAL RESONATORS

[75] Inventor: Raymond L. Filler, Lebanon, N.J.

[73] Assignee: The United States of America as represented by the Secretary of the Army, Washington, D.C.

[21] Appl. No.: 246,146

[22] Filed: Aug. 29, 1988

[51] Int. Cl.⁴ .............................................. G01R 29/22
[52] U.S. Cl. ........................................ 324/727; 324/80
[58] Field of Search .............. 324/56, 57 Q, 80, 58 R, 324/58.5 R, 58.5 A

[56] References Cited

U.S. PATENT DOCUMENTS

| 4,084,131 | 4/1978 | Matthey | 324/56 |
| 4,158,805 | 6/1979 | Ballato | 324/56 |
| 4,412,172 | 10/1983 | Vig | 324/56 |

FOREIGN PATENT DOCUMENTS 0976402  11/1982  U.S.S.R. .................. 324/56

OTHER PUBLICATIONS

Förster, "Automatische Aufzeichnung des Frequenz-Temperatur-Verlaufs von Schwingquarzen"; Frequenz, (31, 1977, 12; pp. 375–381).

Primary Examiner—Thomas H. Tarcza
Assistant Examiner—Bernarr Earl Gregory
Attorney, Agent, or Firm—Michael Zelenka; Maurice W. Ryan

[57] ABSTRACT

The thermal hysteresis of quartz crystal resonators is measured by exciting two modes of a quartz crystal of interest with an external frequency source at a preselected temperature, calculating the difference frequency as between the modes, resetting to the original set temperature after temporarily altering the temperature, remeasuring the frequencies while maintaining the temperature and the difference frequency at the same respective values as the original values, and taking the mode frequency difference as representative of the thermal hysteresis of the crystal.

3 Claims, 1 Drawing Sheet

METHOD OF MEASURING THE THERMAL HYSTERESIS OF QUARTZ CRYSTAL RESONATORS

The invention described herein may be manufactured, used and licensed by or for the Government for governmental purposes without the payment to me of any royalties thereon.

BACKGROUND AND FIELD OF THE INVENTION

This invention relates in general to the technology of piezoelectricity as evinced in the applications of crystals, particularly quartz crystals, as resonators. In the technical and scientific applications of quartz crystal oscillator devices great emphasis is placed upon, and great benefits derived from, a reliably precise relationship between frequency and temperature, usually referred to as the frequency-temperature (f vs. T) characteristic of these devices. It is known in the art that a basic crystal oscillator, called an XO for crystal oscillator, can have the precision of its frequency-temperature characteristic enhanced by temperature compensation, TXCO, or by oven control, OCXO.

In a temperature-compensated crystal oscillator arrangement, an output signal from a temperature-sensitive transducer device, a thermistor for instance, is applied as a correction signal to a voltage-variable reactance element in the crystal resonator circuit. The consequent reactance changes compensate for deterministic variations in the crystal's frequency-temperature characteristic and make for about a twenty-fold improvment in the frequency-temperature variation accuracy over the same crystal as an XO.

OCXO's or oven-controlled crystal oscillators, comprehend disposing the crystal and any other temperature-sensitive components in a stable oven, the temperature of which is adjusted to the point where a curve of the crystal's frequency-temperature characteristic on Cartesian coordinates has zero slope. OCXO's provide about a thousand-fold improvement on the frequency-temperature variation accuracy over the same crystal as a PXO.

In the field of crystal oscillator devices then, a matter of great importance is accurately to detect and measure the temperature of the quartz resonator in order to be able to effect either measurement, e.g., as in thermometry, or compensation and/or control for the purpose of frequency stabilization against variations in temperature.

There have been a great many significant advances in the art in the attainment of temperature compensation and thermometric control of crystal oscillators and the present day temperature-compensated and/or oven-controlled quartz crystal oscillators are markedly improved over their earlier counterparts of a few years ago.

Improvements in temperature-compensation and oven-control techniques notwithstanding however, it has not always been recognized and understood that the precise dependence of frequency upon temperature and vice versa is not entirely free from small deviations related to the discrete crystal's past thermal history. The effect of hysteresis caused by a given thermal cycling history can become a troublesome characteristic in a precision resonator. In a quartz resonator which operates over a wide temperature range, for instance, these effects, called "retrace" or "hysteresis", are more pronounced due to the wide operational range. If, on the other hand the temperature range is decreased, the magnitude of hysteresis effect is decreased.

The patent application of Schodowski, entitled "Dual Mode Quartz Sensing Device", Ser. No. 487,560, filed Apr. 20, 1983, in issue, Notice of Allowance dated July 31, 1989, relates to an apparatus and system for generating a pair of c-mode harmonic signals with a single vibrating quartz resonator, combining the harmonic outputs of the resonator to a subtractive or additive result according to a multiplier relationship between the higher and lower harmonics of the c-mode harmonic signals generated, and using the resultant frequency to measure according to a nearly linear proportional relationship between the resultant frequency and temperatures. This composite signal is, advantageously, highly sensitive to temperature changes, and Schodowski utilize this feature turned back into the system of his invention to attain an improved thermometric response over a preselected temperature range.

To the extent that my invention herein described and claimed is highly advantageous in enhancing the operation of the Schodowski device, the disclosure of patent application Ser. No. 487,560 is incorporated herein by reference.

Thus, with the extent of the knowledge available on resonator temperature measurement thermal hysteresis and the available techniques in the art for selfcompensating and for otherwise detecting and offsetting the deleterious effects of this phenomenon on the accuracy, presision, and reliability of the f vs. T relationship in quartz crystal resonators, and in the light of the basic fact that hysteresis effect is not a highly precise phenomenon, it can be appreciated that, prior to the time of my invention, there has been no reasonably completely satisfactory way for determining the thermal hysteresis characteristics of quartz crystal resonators.

OBJECTIVES AND BRIEF DESCRIPTION OF THE INVENTION

With this then being the state of the art, I conceived and developed my invention with the principal object of providing a means and an operative technique or method of determining and quantifying the hysteresis effects on a given quartz crystal resonator over a preselected frequency-temperature range with greater accuracy and precision than has been heretofore attained.

A further object of my invention is to provide a hysteresis measurement method which is passive in its nature; that is to say the crystal of interest is excited by an external reference frequency source with a transmission or reflection measurement system to measure the thermal hysteresis.

An important object of my invention is to furnish a means of improving and enhancing the operation of the Schodowski device described in patent application Ser. No. 487,560, hereinabove mentioned.

These and other features, objectives, and advantages of my invention will be the more readily understood and appreciated in the light of the following detailed description and the drawing, wherein:

FIG. 1 is a schematic diagram showing the manner in which a quartz crystal to be evaluated according to my invention is connected in circuit to an external excitation frequency source, and FIG. 2 is a graph plot on Cartesean coordinates showing a temperature cycle effect on frequency reponse, or hysteresis.

DETAILED DESCRIPTION OF THE INVENTION AND A PREFERRED EMBODIMENT

In general, my invention comprehends a method of measuring the thermal hysteresis of a quartz crystal resonator which method comprises the combination of the steps of exciting two (2) modes, the fundamental, $f_f$, and the third overtone, $f_t$, of a quartz crystal with an external frequency source while the crystal is maintained at a preselected temperature; measuring the frequency of each of the two (2) modes at time $t_1$, $f_{f(1)}$, and $f_{t(1)}$, by varying the frequency of the external frequency source for each of the modes until the phase shift across the resonator in each instance is zero; where $f_{f(1)}$ is the frequency of the fundamental mode and $f_{t(1)}$, is the frequency of the third overtone; computing the difference frequency, $\Delta f_{(1)}$, according to the expression $$\Delta f_{(1)} = |3f_{f(1)} - f_{t(1)}|;$$

changing the temperature by any arbitrary amount, but within the operating temperature range of the crystal being evaluated; resetting the temperature at time $t_2$ to the first-set temperature at which $\Delta f_{(1)}$ was obtained; measuring the frequency $f_{f(2)}$ and $f_{t(2)}$ of each of the respective modes and concurrently adjusting the temperature so the $\Delta f(2)$ computed from $|3f_{f(2)} - f_{t(2)}|$ is equal to the first-obtained $\Delta f_{(1)}$, and then taking the difference frequencies $$\Delta f_{f(1,2)} = f_{f(2)} - f_{f(1)}$$

$$\Delta f_{t(1,2)} = f_{t(2)} - f_{t(1)}$$

as indicative and representative of the thermal hysteresis of each of the respective said two modes of the resonator at that particular preselected temperature, after a change away from that temperature, followed by a return thereto.

Additional hysteresis points can be obtained for a plot or tabulation at different temperature values by selecting additional temperature settings and repeating the afforeceited steps.

Figure 1:
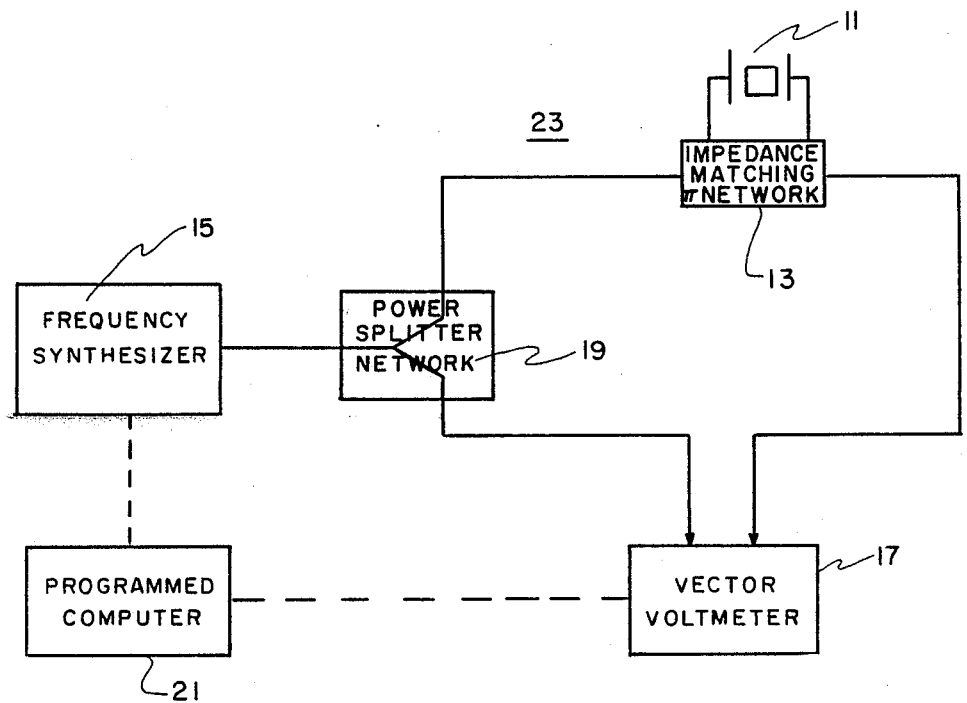

Turning now to the drawings, FIG. 1 shows a schematic diagram of the equipment, the circuitry, and the test sample quartz crystal to practice my invention.

A quartz crystal 11 to be evaluated is connected in circuit through an impedance matching $\pi$ network 13 with a frequency synthesizer 15 and a vector voltmeter 17. A power splitter network 19 is disposed in the circuit as shown to accomodate power balance requirements as between the several elements in the circuit. A programmed computer 21 is used advantageously to run the synthesizer 15, accept input from the vector voltmeter 17, and coordinate, tabulate, and record results.

The quartz crystal 11 and the impedance matching network 13 reside in a temperature-controlled zone 23, the temperature of which is selectably varied through each measuring run made in accordance with the method of my invention.

In operation it is not necessary to set the zone 23 at, or to record, any particular temperature, it is only necessary that the temperature be selectively variable to span a range for which hysteresis is being evaluated.

As a first step, the frequency $f_{f(1)}$, for the fundamental mode of quartz crystal 11 is measured at timed $t_1$ by sweeping with the synthesizer 15 until a zero phase reading is obtained on vector voltmeter 17. Similarly, the natural frequency $f_{t(1)}$ of the third overtone mode is determined. These $f_{f(1)}$ and $f_{t(1)}$ values may, if preferred, be fed into the computer 21 as base line data for the ensuing measurement procedure.

Next, the temperature is swung away from the first set point by any arbitrary amount. It is not necessary, it should be noted, to measure or record this swing, it being only necessary that it is to a temperature value within the expected operating temperature range of the crystal being evaluated.

After the temperature change on the crystal has been held for a time known to produce temperature hysteresis, the temperature is reset to the first preselected temperature value, the frequency source is adjusted to zone-phase new $f_{f(2)}$ and $f_{t(2)}$ values while concurrently adjusting the temperature to achieve the condition $$\Delta f_{(2)} = f_{f(2)} - f_{t(2)} = \Delta f_{(1)}$$

When this circumstance is realized, the hysteresis is represented and indicated by $$\Delta f_{f(1,2)} = f_{f(2)} - f_{f(1)}$$

$$\Delta f_{t(1,2)} = f_{t(2)} - f_{t(1)}$$

Next, in a series of temperature change steps, a corresponding series of frequency values are determined by zero phase readings on the vector voltmeter 17 and these data may also be fed into the computer 21 as $f_{f(t)}$ and $f_{t(t)}$ values.

Further, in accordance with an advantageous method of practicing the invention, the programmed computer 21 performs the mathematical steps described hereinabove, and may even produce the hysteresis plots of the type shown in FIG. 2 of the drawing.

Referring th FIG. 2 of the drawing, the series of $\Delta f_{(t)}$ values obtained in a measurement run according to the method of my invention described hereinabove is plotted out on the graph according to the values of the temperature in degrees Celsius which they image or represent. Frequency change to any appropriate $\Delta f$ scale, is plotted out vertically along the ordinate or y-axis.

Figure 2:
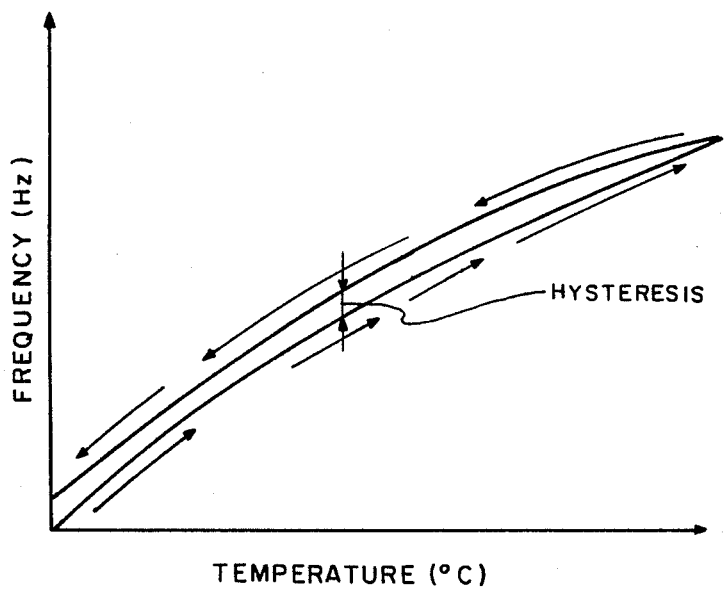

As shown in FIG. 2 of the drawing, incremental (coming back) decreases along the x-axis temperature scale produce different frequency values along the y-axis than do the same incremental (going out) increases. The difference between the two frequency values at any value of $\Delta f$ along the abscissa of the graph of FIG. 2 is representative of the thermal hysteresis.

The foregoing description of my invention is intended to be illustrative only and should not be construed in any limiting sense, it being intended to define the invention by the appended claims.

What is claimed is:

1. A method of measuring the thermal hysteresis of a quartz crystal resonator, which method comprises the combination of the steps of:
   (a) establishing and maintaining a preselected temperature on the quartz crystal being measured;
   (b) exciting two (2) modes, $f_{A(1)}$ and $f_{B(1)}$ of said quartz crystal with an external frequency source;

(c) measuring the frequency $f_{A(1)}$ and $f_{B(1)}$ of each of said modes by varying the frequency of said external frequency source until the phase shift across the resonator is, in each instance, zero;

(d) computing the difference frequency, $\Delta f_{(1)}$ according to the expression $$\Delta f_{(1)} = |K \cdot f_{A(1)} - f_{B(1)}|;$$

where K is a constant number chosen to make $\Delta f$ convenient;

(e) changing the temperature by an amount within the expected operating temperature range of the quartz crystal;

(f) resetting the temperature to approximately said first recited preselected temperature;

(g) in a series of steps, each of which is performed at a further reset temperature, measuring the frequency $f_{A(2)}$ and $f_{B(2)}$ of each of said modes while said quartz crystal is maintained at a reset temperature by varying the frequency source for each of the modes until the phase shift across the resonator is, in each instance, zero;

(h) comparing the difference frequency $\Delta f_{(2)}$ computed from the expression $$\Delta f_{(2)} = f_{A(2)} - f_{B(2)}$$

to the difference frequency $\Delta f_{(1)}$;

(i) repeating the steps g and h until $\Delta f_{(2)}$ is equal to $\Delta f_{(1)}$; and interpreting the frequency differences $$\Delta f_{A(1,2)} = f_{A(2)} - f_{A(1)}$$

and $$\Delta f_{B(1,2)} = f_{B(2)} - f_{B(1)}$$

as indicative and representative of the thermal hysteresis of each of the respective said two modes of said quartz crystal resonator at said preselected temperature, after a change away from that temperature followed by a return thereto.

2. A method according to claim 1 wherein a preselected temperature other than said first recited preselected temperature within the expected operating temperature range of said quartz crystal is established and maintained, and steps b through e of claim 1 are repeated for additional frequencies $f_{A(3)}$, $f_{B(3)}$, $f_{A(4)}$, $f_{B(4)}$, and computation of additional difference values $\Delta f_{(3)}$, $\Delta f_{(4)}$, $\Delta A_{(3,4)}$, $\Delta B_{(3,4)}$;

whereby the thermal hysteresis of each of the respective two modes of said quartz crystal resonators is established at a second preselected temperature.

3. A method according to claim 2 repeated continually to establish thermal hysteresis indicia at multiple temperature values within the expected operating temperature range of said quartz crystal.

* * * * *